US007336545B2

(12) United States Patent
Tanzawa

(10) Patent No.: US 7,336,545 B2
(45) Date of Patent: Feb. 26, 2008

(54) SEMICONDUCTOR DEVICE HAVING SWITCH CIRCUIT TO SUPPLY VOLTAGE

(75) Inventor: Toru Tanzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 11/232,999

(22) Filed: Sep. 23, 2005

(65) Prior Publication Data

US 2006/0017077 A1 Jan. 26, 2006

Related U.S. Application Data

(62) Division of application No. 10/328,024, filed on Dec. 26, 2002, now Pat. No. 6,977,850.

(30) Foreign Application Priority Data

Dec. 27, 2001 (JP) ............................. 2001-395748

(51) Int. Cl.
G11C 5/14 (2006.01)
G11C 16/30 (2006.01)
G11C 16/14 (2006.01)
G11C 16/12 (2006.01)
G11C 7/12 (2006.01)
G11C 8/08 (2006.01)

(52) U.S. Cl. ............................. 365/189.09; 365/189.11; 365/226; 365/185.18

(58) Field of Classification Search ........... 365/185.18, 365/189.09, 189.11, 185.25, 226, 185.23, 365/189.06, 230.06
See application file for complete search history.

(56) References Cited

U.S. PATENT DOCUMENTS 5,442,586 A * 8/1995 Javanifard et al. ...... 365/185.29
5,444,664 A * 8/1995 Kuroda et al. ............... 365/226
5,708,606 A * 1/1998 Tanzawa et al. ........ 365/185.17

(Continued)

FOREIGN PATENT DOCUMENTS

JP 62-197997 9/1987
JP 10-79191 3/1998
JP 10-106283 4/1998

OTHER PUBLICATIONS

Georghe Samachisa, et al., "A 128K Flash EEPROM using Double Polysilicon Technology", ISSCC digest of technical Papers, Session VII: Nonvolatile Memory, Feb. 25, 1982, pp. 76-77.

(Continued)

*Primary Examiner*—J. H. Hur
(74) *Attorney, Agent, or Firm*—Oblon, Spivak, McClelland, Maier & Neustadt, P.C.

(57) ABSTRACT

A memory cell array has memory cells arranged in a matrix form. The memory cell includes a floating gate and a control gate. Word lines are each coupled to the control gates of the memory cells which are arranged on a corresponding one of the rows in the memory cell array. Bit lines are each coupled to drains of the memory cells which are arranged on a corresponding one of the columns in the memory cell array. An external voltage is supplied from the exterior to an external voltage input terminal. A first voltage generating circuit lowers the external voltage to generate a voltage which is to be supplied to the word line coupled to the control gates. A second voltage generating circuit lowers the external voltage to generate a voltage which is to be supplied to the bit line coupled to the drains.

6 Claims, 11 Drawing Sheets

U.S. PATENT DOCUMENTS 5,768,194 A * 6/1998 Matsubara et al. .... 365/185.33
2002/0139999 A1* 10/2002 Hirano ...................... 257/200

OTHER PUBLICATIONS

John F. Dickson, "On-Chip High Voltage Generation in MNOS Integrated Circuits Using an Improved Voltage Multiplier Technique", IEEE Journal Solid-State Circuits, vol. SC-11, No. 3, Jun. 1976, pp. 374-378.

Akira Umezawa, et al., A 5-V-Only Operation 0.6μm Flash EEPROM with Row Decoder Scheme in Triple-Well Structure, IEEE Journal Of Solid-State Circuits, vol. 27, No. 11, Nov. 1992, pp. 1540-1546.

* cited by examiner

| | Read | Program | Erase |
|---|---|---|---|
| Vg | 5V | 9V | −7V |
| Vd | 1V | 5V ("0")<br>0V ("1") | Floating |
| Vs | 0V | 0V | 10V |
FIG. 4 (PRIOR ART)
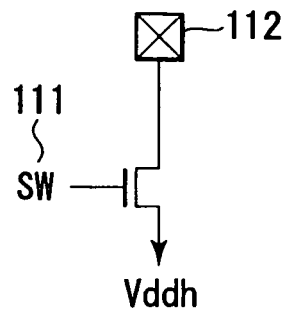
FIG. 5 (PRIOR ART)
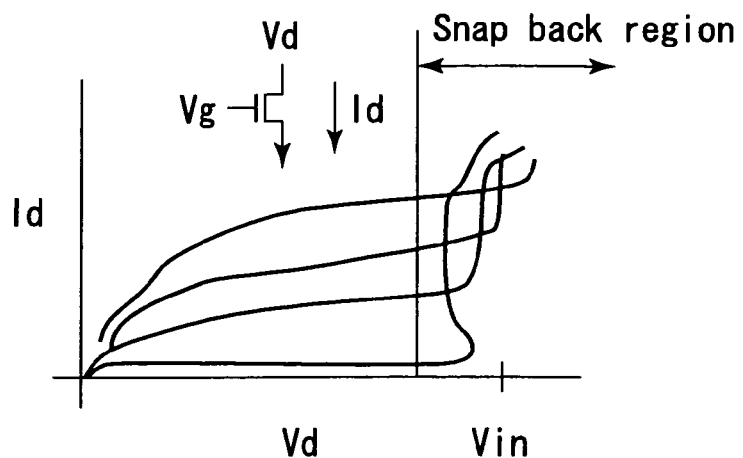
FIG. 6 (PRIOR ART)
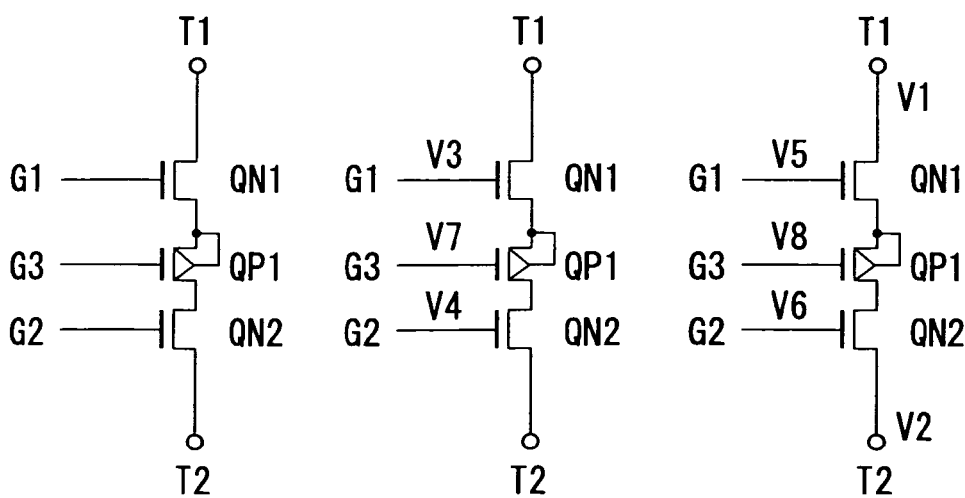
FIG. 8A  FIG. 8B  FIG. 8C

SEMICONDUCTOR DEVICE HAVING SWITCH CIRCUIT TO SUPPLY VOLTAGE

CROSS-REFERENCE TO RELATED APPLICATIONS

This application is a divisional of application Ser. No. 10/328,024 filed Dec. 26, 2002 (now U.S. Pat. No. 6,977,850), which in turn is based upon and claims the benefit of priority from the prior Japanese Patent Application No. 2001-395748, filed Dec. 27, 2001, the entire contents of each of which are incorporated herein by reference.

BACKGROUND OF THE INVENTION

1. Field of the Invention

This invention relates to a semiconductor device having a switch circuit and more particularly to a semiconductor device having a switch circuit to supply voltage to word lines or bit lines of a semiconductor memory device.

2. Description of the Related Art

Conventionally, as one of semiconductor memory devices, an electrically programmable and erasable flash memory is known. FIG. 1 shows the element cross sectional structure of one memory cell in the flash memory. As shown in FIG. 1, an N-type well region 102 is formed in a P-type semiconductor substrate 101. Further, a P-type well region 103 is formed in the N-type well region 102. In the P-type well region 103, a source region 104 and drain region 105 of the memory cell which are each formed of an $n^+$-type region are separately formed. Further, a floating gate 106 is formed above the channel region formed between the source region 104 and the drain region 105 with an insulating film (not shown) disposed therebetween. A control gate 107 is formed above the floating gate 106 with an insulating film (not shown) disposed therebetween.

A contact region 108 formed of a $P^+$-type region is formed in the P-type semiconductor substrate 101. A contact region 109 formed of an $n^+$-type region is formed in the N-type well region 102. Further, a contact region 110 formed of a $P^+$-type region is formed in the P-type well region 103.

When the memory cell is operated, gate voltage Vg, drain voltage Vd and source voltage Vs are respectively applied to the control gate 107, drain region 105 and source region 104. Further, the same voltage as the source voltage Vs is supplied to the contact region 109 of the N-type well region 102 and the contact region 110 of the P-type well region 103. In addition, a ground voltage of 0V is supplied to the contact region 108 of the P-type semiconductor substrate 101.

In the memory cell, the threshold voltage as viewed from the control gate 107 varies according to the number of electrons accumulated in the floating gate 106. The memory cell stores a "1" level or "0" level of data by use of a variation in the threshold voltage. A memory cell array can be configured by arranging a plurality of memory cells which are the same as the above memory cell.

FIG. 2 is a circuit diagram showing a memory cell array of a NOR type flash memory. As shown in FIG. 2, a plurality of memory cells MC are arranged in a matrix form. The control gates of the memory cells MC which are arranged on the same row are commonly connected to a corresponding one of a plurality of word lines WL0 to WLn. The drain regions of the memory cells MC which are arranged on the same column are commonly connected to a corresponding one of a plurality of bit lines BL0 to BLm. Generally, the memory cells are divided into a plurality of blocks and the source regions of the memory cells MC of the same block are commonly connected to a corresponding one of a plurality of source lines SLi.

FIG. 3 is a diagram showing the relation between a drain current flowing in the drain of the memory cell and gate voltage supplied to the control gate at the operation time of the memory cell. As shown in FIG. 3, a state in which the number of electrons accumulated in the floating gate is relatively large, that is, a state in which the threshold voltage Vt of the memory cell is high is defined as "0" data. On the other hand, a state in which the number of electrons accumulated in the floating gate is relatively small, that is, a state in which the threshold voltage Vt of the memory cell is low is defined as "1" data.

FIG. 4 shows the bias conditions at the data readout time, program time and erase time and shows one example of values of the gate voltage Vg, drain voltage Vd and source voltage Vs which are supplied to the memory cell at the operation time.

In the data readout operation, whether data is "0" data or "1" data is determined based on whether or not a cell current flows when the gate voltage Vg=Vread, for example a voltage of 5V is applied to the control gate while preset voltage, for example, the drain voltage Vd of 1V is being supplied to the drain region. The above determination is made by comparing the cell current of the memory cell from which data is to be read out with a reference current Iref flowing in a reference cell by use of a sense amplifier (not shown).

The data erase operation is simultaneously performed for a plurality of memory cells commonly having the source and P-type well region. At the erase time, electrons are caused to flow from the floating gate to the P-type well region based on the Fowler-Nordheim tunneling phenomenon (which is hereinafter referred to as the FN tunneling phenomenon) while the gate voltage VG is set at −7V, the source voltage Vs is set at 10V, for example, and the drain voltage Vd is set into an electrically floating state. As a result, the memory cells subjected to the erase process are all set to have "1" data.

The data program operation is performed for each memory cell, that is, for each bit. For example, the bit line of the memory cell in which "0" data is to be programmed is biased to 5V so as to inject high energy electrons generated based on the channel hot electron phenomenon into the floating gate. The bit line of the memory cell in which original "1" data is kept unchanged is set at 0V. By setting the bit line at 0V, electrons are not injected into the floating gate in the non-programmed memory cell and the threshold voltage Vt is kept unchanged.

Further, in the flash memory, the program verify and erase verify operations are performed to confirm the program and erase degrees. As shown in FIG. 3, at the program verify time, gate voltage supplied to the control gate is set equal to a program verify voltage Vpv of approximately 7V which is higher than the read voltage Vread of 5V used at the readout time and the "0" data read operation is performed. Then, the program operation and the program verify operation are alternately and repeatedly performed and the program operation is terminated when data items of the memory cells to be programmed are all set to "0".

Further, as shown in FIG. 3, at the erase verify time, gate voltage supplied to the control gate is set equal to an erase verify voltage Vev of approximately 3.5V which is lower than the read voltage Vread=5V used at the readout time and the "1" data read operation is performed. Then, the erase operation and the erase verify operation are alternately and repeatedly performed and the erase operation is terminated when data items of the memory cells to be erased are all set to "1". Thus, a sufficiently large cell current Icell can be acquired.

The gate voltage Vg supplied to the control gate via the word line of the flash memory is set higher than the power supply voltage at the readout time, erase time or program time. The source voltage Vs supplied to the source line is set higher than the power supply voltage at the erase time. Further, the drain voltage Vd supplied to the drain via the bit line is set higher than the power supply voltage at the program time. Conventionally, the above voltages are supplied by inputting a voltage Vpp of approximately 12V from the exterior as is disclosed in ISSCC digest of technical papers, pp. 76 to 77, 1987 or the like. FIG. 5 shows a switch circuit which controls the voltage Vpp (12V) supplied from the exterior. As shown in FIG. 5, a switch 111 transfers the voltage Vpp (12V) applied to a Vpp pad 112 into an internal portion as it is.

Further, a booster circuit which can generate high voltage used for rewriting data in a chip is disclosed in a document by J. F. Dickson, "On-Chip High-Voltage Generation in MNOS Integrated Circuits Using an Improved Voltage Multiplier Technique", IEEE J. Solid-State Circuits, Vol. SC-11, No. 3, pp. 374 to 378, Jun. 1976 or the like. Further, an example in which unification of the power supply is made by use of the above booster circuit is disclosed in A. Umezawa et al., "A 5V-Only Operation 0.6 µm Flash EEPROM with Row Decoder Scheme in Triple-Well Structure," IEEE J. Solid-State Circuits, Vol. 27, No. 11, pp. 1540 to 1546, Nov. 1992 and thus unification of the power supply has been studied and developed.

In recent years, the flash memory is designed to be operated on lower voltage, voltage Vddh supplied to the word line or source line is approximately 0V to 10V and voltage Vddp supplied to the bit line is approximately 0V to 5V. Therefore, the withstand voltage of the element in the chip is set to approximately 10V.

FIG. 6 shows a Vd-Id characteristic of an N-type transistor with the withstand voltage of 10V. If a high voltage of approximately 12V is applied to the transistor with the above characteristic, it is operated in a snap back region as shown in FIG. 6 and there occurs a problem that the stable operation cannot be attained.

Further, in a case where the voltage Vddh supplied to the word line or source line is generated in the internal portion by use of the booster circuit and only the voltage Vddp supplied to the bit line is generated by use of a voltage Vpp of approximately 5V input from the exterior, it takes a long time to boost the voltage supplied to the word line or source line. Therefore, for example, if it is desired to program data at high speed when the device is shipped from the factory, multiple bits cannot be programmed at the same time and there occurs a problem that it takes a long time to program data.

BRIEF SUMMARY OF THE INVENTION

A semiconductor device according to an aspect of this invention comprises a memory cell array having a plurality of memory cells arranged in a matrix form, each of the memory cells having a floating gate and a control gate and data stored in the memory cell being electrically programmable and erasable, a plurality of word lines each commonly coupled to the control gates of a plurality of memory cells which are arranged on a corresponding one of the rows in the memory cell array, a plurality of bit lines each commonly coupled to drains of a plurality of memory cells which are arranged on a corresponding one of the columns in the memory cell array, an external voltage input terminal to which an external voltage is supplied from the exterior, a first voltage generating circuit which lowers the external voltage supplied to the external voltage input terminal and generates a voltage to be supplied to the word line connected to the control gates of the memory cells, and a second voltage generating circuit which lowers the external voltage supplied to the external voltage input terminal and generates a voltage to be supplied to the bit line connected to the drains of the memory cells.

A semiconductor device having a switch circuit according to another aspect of this invention comprises a first transistor of a first conductivity type having a drain connected to a first terminal and a gate which is controlled by a first voltage, and a second transistor of the first conductivity type having a drain connected to a source of the first transistor, a source connected to a second terminal and a gate which is controlled by a second voltage different from the first voltage, wherein a fourth voltage obtained by lowering a third voltage applied to the first terminal is output to the second terminal in an operative mode and the first voltage is set higher than the second voltage and the third voltage is set higher than the first voltage in a non-operative mode.

BRIEF DESCRIPTION OF THE SEVERAL VIEWS OF THE DRAWING

FIG. 4 is a diagram showing the bias conditions at the data readout time, program time and erase time;

FIG. 5 is a circuit diagram showing a conventional Vpp switch circuit;

FIG. 6 is a characteristic diagram showing a Vd-Id characteristic of a conventional N-type transistor with a withstand voltage of 10V;

FIGS. 8A, 8B, 8C are circuit diagrams showing the configurations of a switch circuit according to the first embodiment;

DETAILED DESCRIPTION OF THE INVENTION

First Embodiment

Figure 1:
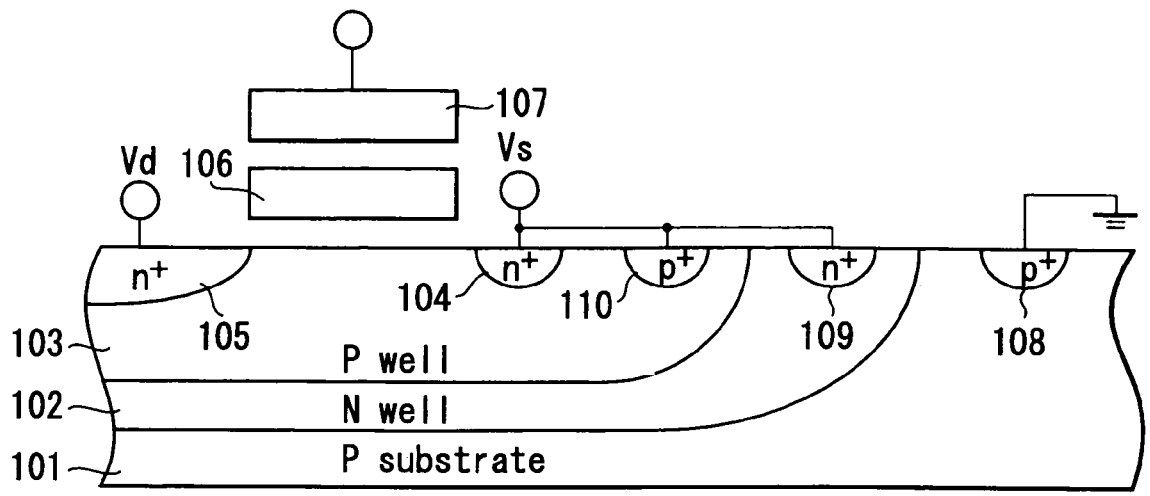
FIG. 1 is a cross sectional view showing an element cross sectional structure of one memory cell in a flash memory.
Figure 2:
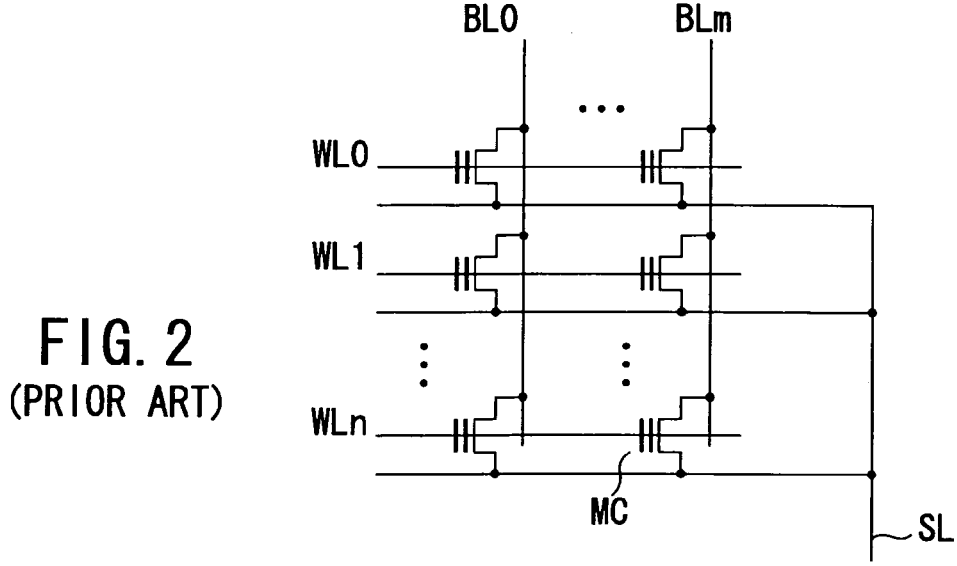
FIG. 2 is a circuit diagram showing the configuration of a NOR type flash memory cell array.
Figure 3:
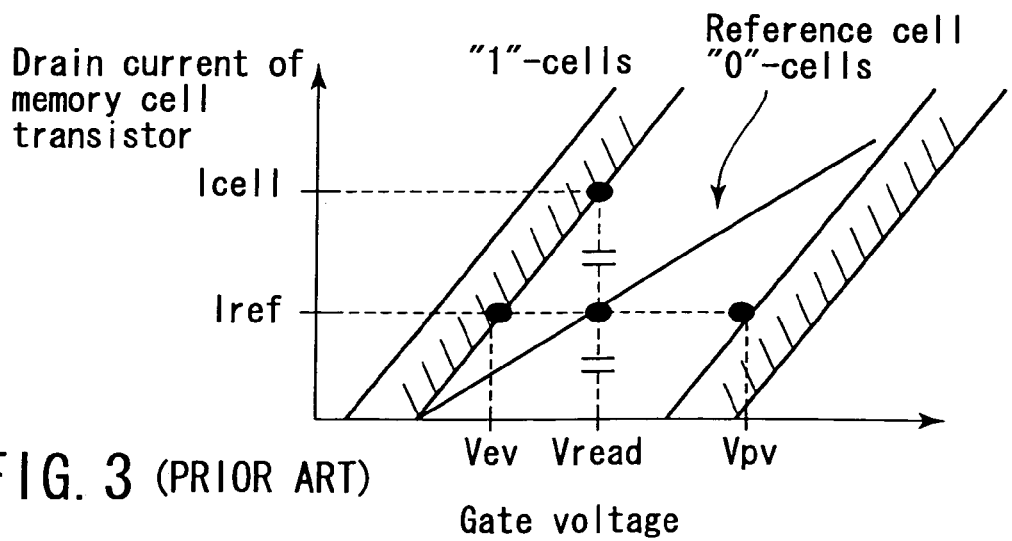
FIG. 3 is a characteristic diagram showing the relation between a drain current flowing in the drain of the memory cell and gate voltage supplied to the control gate of the memory cell.
Figure 7:
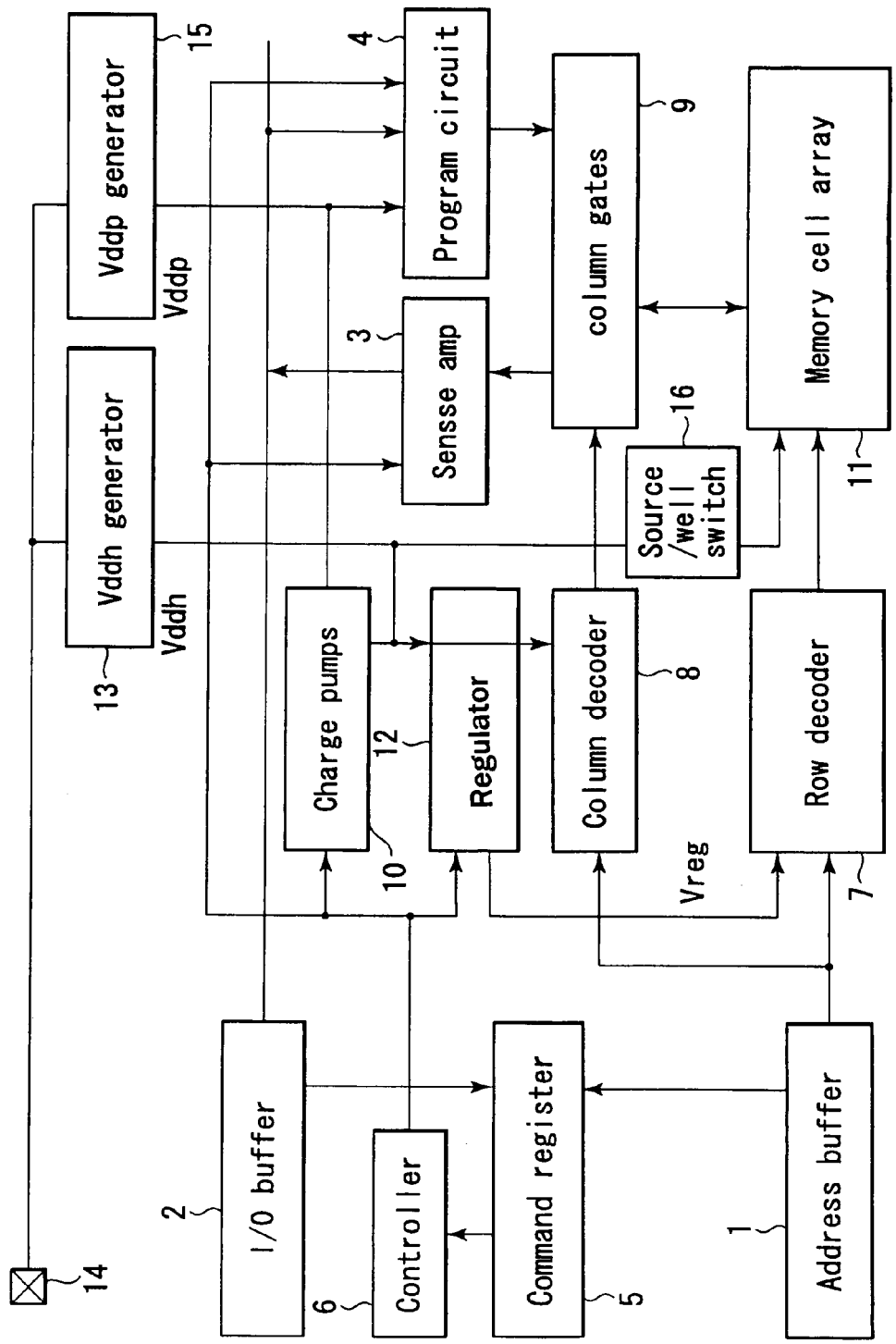
FIG. 7 is a block diagram showing a flash memory according to a first embodiment of the present invention.

There will now be described a semiconductor device according to a first embodiment of this invention with reference to the accompanying drawings. FIG. 7 is a block diagram of a flash memory according to the first embodiment.

As shown in FIG. 7, an address buffer 1 receives an external address and outputs an internal address corresponding to a memory cell which is subjected to the readout, program or erase operation. An I/O buffer 2 outputs data stored in a memory cell and sensed and amplified by a sense amplifier 3 to the exterior at the readout time and inputs program data into a program circuit 4 at the program time. The program circuit 4 supplies program voltage to the drain of a corresponding memory cell in a memory cell array 11 via a corresponding bit line.

A command register 5 holds a command input at the program time or erase time. A controller 6 generates control signals to control various circuits in the flash memory. A row decoder 7 selects a word line corresponding to the internal address output from the address buffer 1. A column decoder 8 selects a column gate of a column gate circuit 9 corresponding to the internal address output from the address buffer 1 to connect the sense amplifier 3 or program circuit 4 to the bit line.

A charge pump circuit 10 boosts the input power supply voltage to output voltage which is supplied to a memory cell array 11 at the time of readout, program or erase. A regulator 12 receives voltage Vpp which is higher than the power supply voltage and outputs controlled voltage Vreg. The voltage Vreg is supplied to the word line selected by the row decoder 7.

A Vddh generator 13 converts voltage Vpp supplied from a Vpp pad 14 into word line power supply voltage Vddh which is supplied to the word line connected to the control gate of the memory cell at the program time. The word line power supply voltage Vddh is supplied to the common well region or source of the memory cell at the erase time. A Vddp generator 15 converts the voltage Vpp supplied from the Vpp pad 14 into bit line power supply voltage Vddp which is supplied to the bit line connected to the drain of the memory cell at the program time.

A source/well switch 16 causes the voltage Vddh to be selectively supplied to the well region or the source of each block via the source line at the data erase time.

FIGS. 8A, 8B, 8C show the configurations of a switch circuit used in the Vddh generator 13 according to the first embodiment of the present invention.

As shown in FIG. 8A, the switch circuit includes an N-channel MOS transistor QN1, P-channel MOS transistor QP1 and N-channel MOS transistor QN2.

The drain of the NMOS transistor QN1 is connected to a terminal T1 connected to an external terminal (not shown) to which voltage is supplied from the exterior. The source of the NMOS transistor QN1 is connected to the source and the back gate of the PMOS transistor QP1. The drain of the NMOS transistor QN2 is connected to the drain of the PMOS transistor QP1 and the source thereof is connected to an output terminal T2. The threshold voltage of the NMOS transistor QN2 is higher than that of the NMOS transistor QN1.

As shown in FIG. 8B, when the switch circuit is set in an OFF state, for example, voltage V3 (=Vcc) is applied to the gate of the NMOS transistor QN1, voltage V4 (=0V) different from the voltage V3 is applied to the gate of the NMOS transistor QN2, and voltage V7 (=0V) is applied to the gate of the PMOS transistor QP1. At this time, since the threshold voltage of the NMOS transistor QN1 is low, there occurs a possibility that the voltage of a circuit (not shown) connected to the output terminal T2 may leak into the terminal T1 side. Therefore, in order to prevent extra voltage from leaking into the terminal T1 side by use of the NMOS transistor QN2 having higher threshold voltage than that of the NMOS transistor QN1, the NMOS transistor QN2 is set into the cut-off state.

As shown in FIG. 8C, when the switch circuit is set in an ON state, high voltage V1 is applied to the terminal T1. Voltage V5 which turns ON the NMOS transistor QN1 is applied to the gate of the NMOS transistor QN1 with the high voltage V1 applied to the terminal T1. Voltage V6 which turns ON the NMOS transistor QN2 is applied to the gate of the NMOS transistor QN2 while voltage V2 is being output to the output terminal T2. Voltage V8 which turns ON the PMOS transistor QP1 when the high voltage V1 is applied to the source side thereof and turns OFF the PMOS transistor QP1 when voltage on the drain side thereof is set to the voltage V2 is applied to the gate of the PMOS transistor QP1. By thus setting the voltages V5, V6, V8 supplied to the respective gates in the above-described manner, the output voltage V2 of the switch circuit is controlled to attain the relation of V2<V1. Therefore, it becomes possible to lower the high voltage supplied from the exterior and stably supply the voltage to the transistors in the chip.

Figure 9:
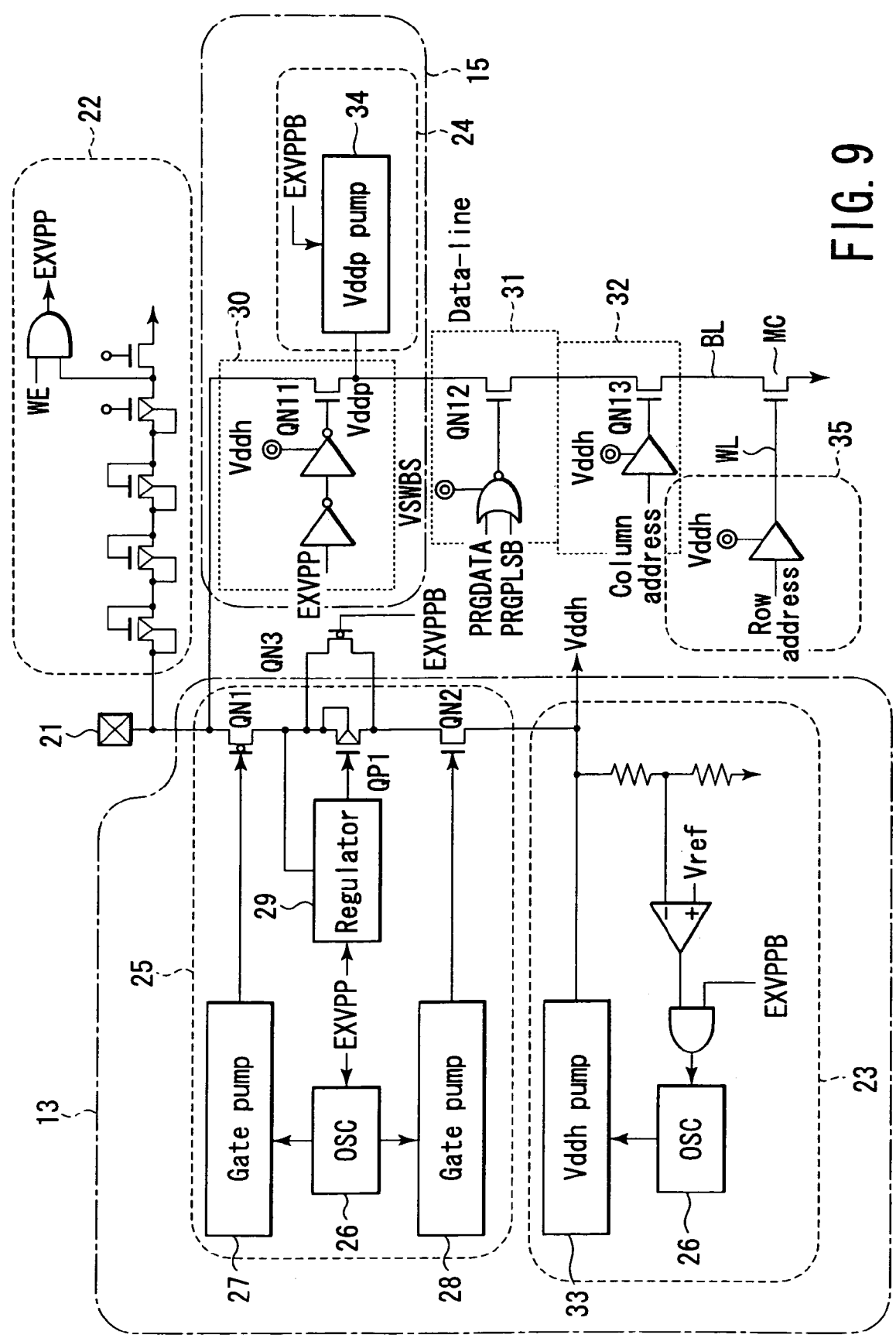
FIG. 9 is a circuit diagram showing the configurations of a Vddh generating circuit and Vddp generating circuit according to the first embodiment.

FIG. 9 shows the configurations of the Vddh generator and the Vddp generator according to the first embodiment and containing the switch circuit shown in FIGS. 8A, 8B, 8C.

For example, if a high voltage Vpp of approximately 12V is applied to a Vpp pad 21 in a case where it is required to program data at high speed at the time of shipment from the factory, a detector circuit 22 detects the high voltage Vpp and a write enable signal WE is set at the "H" level so that a signal EXVPP="H" and a signal EXVPPB="L" may be output.

While the signal EXVPPB="L" is input to a Vddh booster circuit 23 and a Vddp booster circuit 24, the Vddh booster circuit 23 and the Vddp booster circuit 24 are not operated.

If the signal EXVPP="H" is input to an oscillator circuit (OSC) 26 in a Vddh switch circuit 25, voltages of approximately 15V are generated from first and second gate pumps 27 and 28 and respectively supplied to the gates of the NMOS transistors QN1, QN2. As a result, the NMOS transistors QN1, QN2 are turned ON and the voltage Vpp supplied to the Vpp pad 21 from the exterior is transferred.

Further, if the signal EXVPP="H" is input to a regulator 29, negative feedback occurs and voltage transferred from the PMOS transistor QP1 to the NMOS transistor QN2 is controlled to be set to approximately 10V. The voltage of 10V is transferred as it is via the NMOS transistor QN2 and output as the voltage Vddh of 10V.

After this, the output voltage Vddh of 10V is input to the regulator 12 shown in FIG. 7 which in turn generates controlled voltage Vreg (=approximately 9V). The voltage Vreg is supplied to a word line selected by the row decoder 7.

If the signal EXVPP="H" is input to a Vddp switch circuit 30, the voltage Vddh of 10V is input to the gate of an NMOS transistor QN11 so that the voltage Vpp of 12V supplied from the exterior can be transferred via the NMOS transistor QN11. Then, voltage which is lowered by the threshold voltage of the NMOS transistor QN11, for example, a voltage Vddp of approximately 7V is output to a data line DL.

The voltage Vddp (=7V) supplied to the data line DL is input to a program circuit 31. The data line DL is controlled based on pulse signals PRGPLS, PRGPLSB according to program data PRGDATA and biased by a signal VSWBS which is control voltage to clamp the voltage Vddp at optimum program bit line voltage. When the program data PRGDATA is "1", an NMOS transistor QN12 is set into an OFF state even if the signal VSWBS is 0V and the signal PRGPLS is "H", that is, the signal PRGPLSB is "L". Therefore, the data line DL is set into an electrically floating state and data is not programmed into the memory cell MC.

On the other hand, when the program data PRGDATA is "0", the NMOS transistor QN12 is set into an ON state in a period in which the signal VSWBS is set at approximately 7V and the signal PRGPLS is "H", that is, the signal PRGPLSB is "L". Therefore, the data line DL is biased to approximately 5V. After this, the voltage of 5V is supplied to the bit line BL via a column gate 32 and data is programmed into the memory cell MC.

Generally, in the case of the program operation, low voltage, for example, a power supply voltage of approximately 2V is supplied to the Vpp pad 21. At this time, the signal EXVPP="L" and signal EXVPPB="H" are output from the detector circuit 22. If the signal EXVPPB="H" is input to the gate of the NMOS transistor QN3, the source-drain path of the PMOS transistor QP1 is short-circuited and the PMOS transistor QP1 cannot permit a current to flow therethrough and cannot transfer voltage. Therefore, the Vddh switch circuit 25 is not operated in a period in which the signal EXVPPB is "H". If the signal EXVPPB="H" is input to the Vddh booster circuit 23, the operation of a Vddh charge pump 33 is started and word line power supply voltage Vddh (=10V) boosted by the operation of the charge pump is output to the regulator 12. The regulator 12 receives the word line power supply voltage Vddh (=10V) and outputs a voltage Vreg of 9V. After this, the voltage Vreg (=9V) is supplied to a word line selected by the row decoder 7.

If the signal EXVPPB="H" is input to the Vddp booster circuit 24, the operation of a Vddp charge pump 34 is started and bit line power supply voltage Vddp (=5V) is output to the data line DL. After this, the bit line power supply voltage Vddp (=5V) is supplied to a bit line BL via the program circuit 31 and column gate 32 and data is programmed into the memory cell MC.

Thus, when it is required to program data at high speed at the time of shipment from the factory, high voltage is applied via the Vpp pad 21 from the exterior and voltage which is controlled by the P-type transistor QP1 whose current path is sandwiched between the N-type transistors QN1 and QN2 is supplied. In the case of the normal program operation, the transistors in the chip can always be operated in a stable region by supplying voltage which is boosted by use of the booster circuit 23 in the internal portion. Further, since high voltage supplied from the exterior is used when it is desired to perform the program operation at high speed, it does not take a long time to boost the voltage of the word line in comparison with a case wherein the voltage is internally boosted and program time can be shortened.

Figure 10:
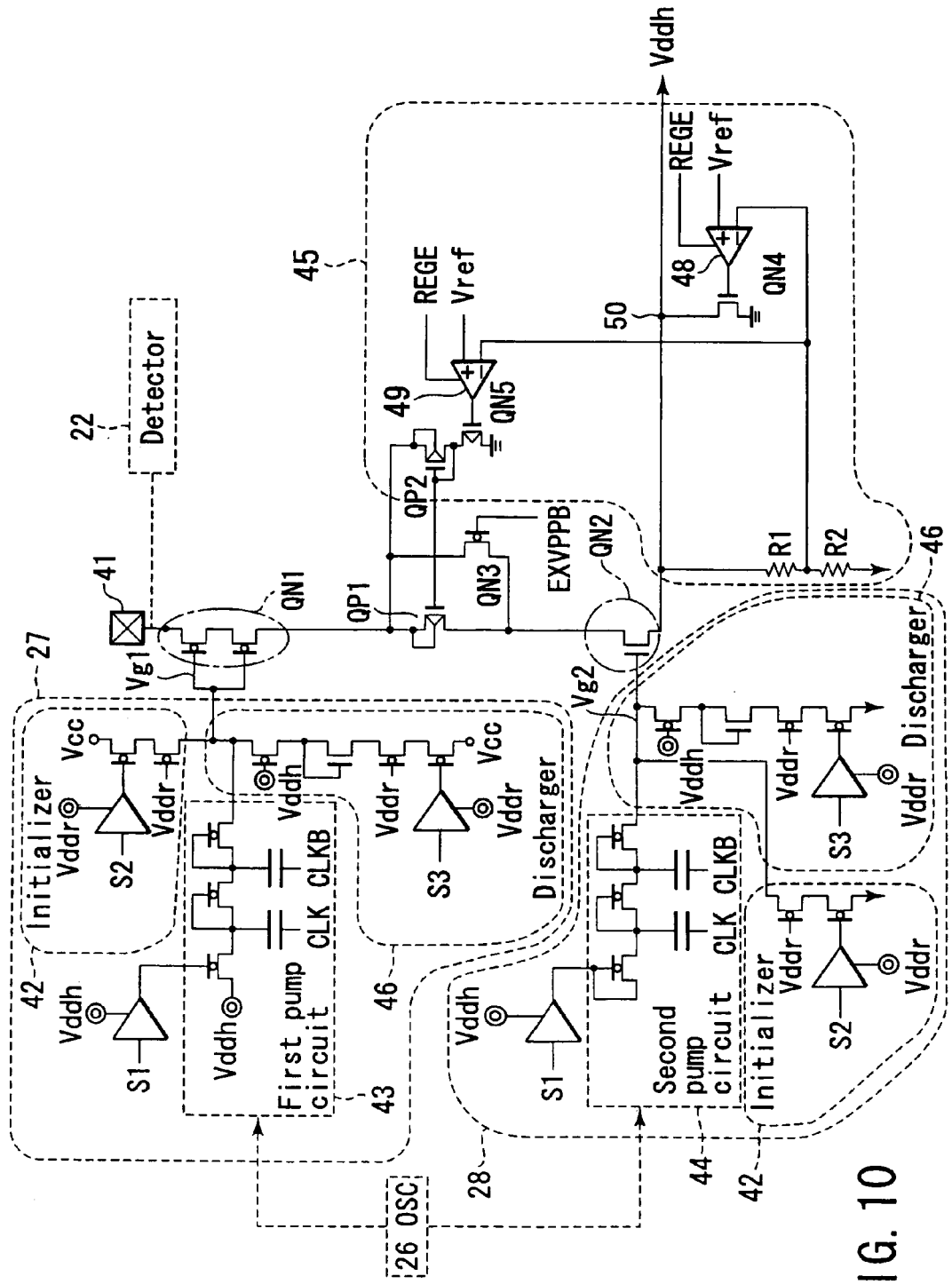
FIG. 10 is a circuit diagram showing the configuration of a Vddh switch circuit according to the first embodiment.

FIG. 10 shows the detail configuration of the Vddh switch circuit. Internally boosted voltage or an externally supplied voltage Vddr of approximately 5V is previously applied to an initializer 42. As a result, the initializer 42 performs the output operation of outputting the power supply voltage Vcc, for example, a voltage of approximately 2V, thereby to initialize the first and second gate pumps 27, 28 and sets the Vddh switch circuit 25 into an initialization state. At this time, the gate voltage Vg1 of the NMOS transistor QN1 is set equal to the power supply voltage Vcc and the gate voltage Vg2 of the NMOS transistor QN2 is set at 0V. If a high voltage Vpp of approximately 12V is applied to a Vpp pad 41 and the detector circuit 22 detects the high voltage and outputs the signal EXVPP="H" and signal EXVPPB="L", a pulse signal with amplitude from 0V to the power supply voltage Vcc output from the oscillator circuit (OSC) 26 is input to the clock input terminals of clock signals CLK, CLKB of first and second pump circuits 43, 44 via a clock signal generator shown in FIG. 11 as a pulse signal with amplitude from 0V to 5V.

Figure 11:
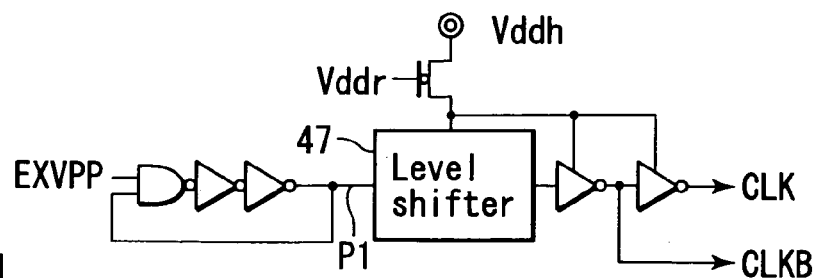
FIG. 11 is a circuit diagram showing the configuration of a clock signal generation circuit according to the first embodiment.

As shown in FIG. 11, the clock signal generator uses the word line power supply voltage Vddh as a power supply source. It generates clock signals CLK, CLKB by inputting a pulse signal P1 with amplitude from 0V to the power supply voltage Vcc to a level shifter 47 and obtaining a pulse signal with amplitude of the voltage Vddr of approximately 5V, for example, by using a voltage of approximately 3V to 6V which is normally generated in the internal portion.

The gate voltages Vg1, Vg2 of the NMOS transistors QN1, QN2 of the Vddh switch circuit 25 are set to approximately 15V at the time of the operation of the Vddh switch circuit. Therefore, the potential difference between two terminals of each of capacitors in the first and second pump circuits 43, 44 is set to approximately 10V by setting the clock signals CLK, CLKB to clock signals with an amplitude of 5V.

Generally, the capacitor is formed of the same material as the gate oxide film of a transistor with high withstand voltage. The withstand voltage of the element in the chip is approximately 10V. Therefore, there occurs a problem in the withstand voltage of the element since the potential difference between two terminals of the capacitor becomes 13V if the pulse signal with Vcc amplitude which is output from the oscillator circuit 26 is supplied to the first and second pump circuits 43, 44 as the clock signals CLK, CLKB. However, like the present embodiment, by using the clock signal generator, the first and second pump circuits 43, 44 can be operated without causing any problem of the withstand voltage of the element. Further, when the clock signals CLK, CLKB are generated, current consumption can be more reduced by supplying the voltage Vddh as the power supply source than by boosting and supplying the power supply voltage Vcc.

The clock signals CLK, CLKB are input to the capacitors of the first and second pump circuits 43, 44 and the voltages Vg1, Vg2 of approximately 15V obtained by boosting the word line power supply voltage Vddh are respectively input to the gates of the NMOS transistors QN1, QN2. Since the gate voltage of the NMOS transistor QN1 is set equal to the power supply voltage Vcc in the initial condition and the threshold voltage thereof is approximately 0V to 0.2V, the switching operation is started when a state in which voltage supplied to a source connected to the Vpp pad 41 has been changed from the power supply voltage Vcc to (Vcc−0.2V) is set.

Figure 12:
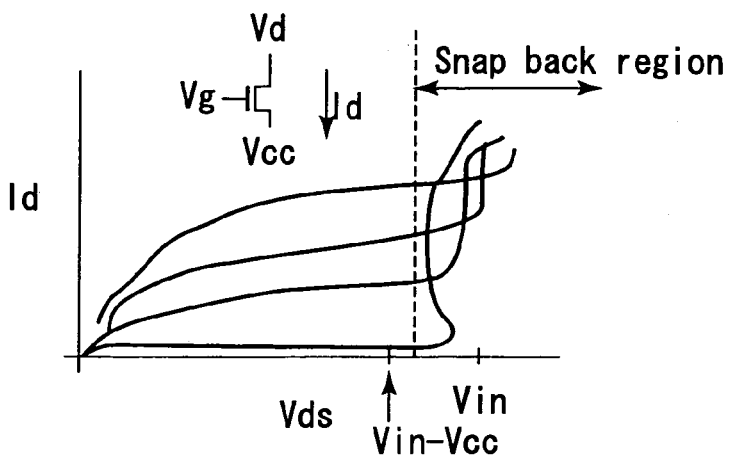
FIG. 12 is a characteristic diagram showing a Vd-Id characteristic of an N-type transistor according to the first embodiment.

As a result, as shown by the Vd-Id characteristic of the N-type transistor with a withstand voltage of 10V in FIG. 12, it is operated on voltage which is lowered by the power supply voltage Vcc. Therefore, the transistor will not be operated in the snap back region and can be stably operated by enhancing the surface breakdown withstand voltage which depends on the drain voltage with respect to the gate.

Since the threshold voltage of the NMOS transistor QN1 is low, there is a possibility that the word line power supply voltage Vddh which is internally boosted without using the Vddh switch circuit will leak into the Vpp pad side when the normal program operation using the voltage Vddh is performed. Therefore, the NMOS transistor QN2 is provided and it is set into a cut-off state in order to prevent the voltage Vddh boosted by the Vddh booster circuit 23 at the normal program operation time from leaking into the Vpp pad side.

The PMOS transistor QP1 is subjected to negative feedback via the regulator 45 and the gate thereof is controlled to set the output voltage thereof to approximately 10V.

The regulator 45 includes two comparators 48, 49, PMOS transistor QP2, NMOS transistors QN4, QN5 and voltage dividing resistors R1, R2. The comparators 48, 49 are controlled and activated according to a regulator activation signal REGE. The source of the PMOS transistor QP2 is connected to the source of the PMOS transistor QP1, the gate thereof is connected to the gate of the PMOS transistor QP1, and the drain thereof is connected to its own gate. Thus, the PMOS transistor QP2 is combined with the PMOS transistor QP1 to configure a current mirror circuit. The drain of the NMOS transistor QN4 is connected to a supply node 50 of the word line power supply voltage Vddh, the source thereof is connected to a ground voltage node and the gate thereof is supplied with an output signal of the comparator 49. The resistors R1, R2 are serially connected between the voltage Vddh supply node and the ground voltage node.

In the regulator 45, the comparators 48, 49 each compare divided voltage of the serial connection node of the resistors R1 and R2 with reference voltage Vref. Then, the NMOS transistors QN4, QN5 are turned ON/OFF based on the comparison results so that the gate voltage of the PMOS transistor QP1 can be controlled and the output voltage of the PMOS transistor QP1 will be controlled to be set equal to approximately 10V.

The NMOS transistor QN3 is provided for the purpose of short-circuiting the source-drain path of the PMOS transistor QP1 so as not to apply voltage between the source and drain of the PMOS transistor QP1 at the normal program operation time.

When the program operation and program verify operation are terminated, the gate voltages Vg1, Vg2 of 15V which are respectively applied to the gates of the NMOS transistor QN1 and QN2 are discharged by use of a discharger 46. After this, an initializing operation is performed by an initializer 42 to set an initialization state. In this case, it is possible for the initializer 42 to perform the discharging operation.

Next, a program circuit which is connected to a data line DL supplied with the bit line power supply voltage Vddp of 10V and supplies program voltage to a corresponding drain in the memory cell array via a bit line is explained with reference to FIGS. 13, 14A, 14B.

Figure 13:
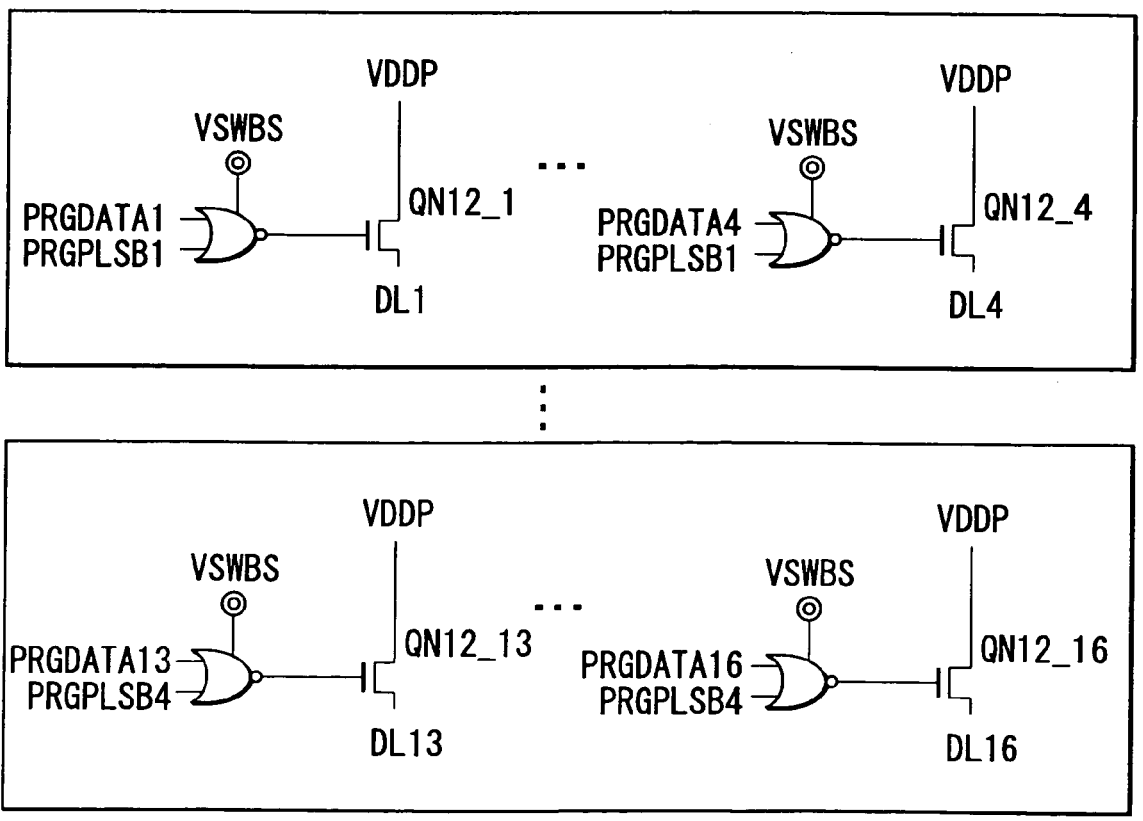
FIG. 13 is a circuit diagram showing the configuration of a program circuit according to the first embodiment.
Figure 14A:
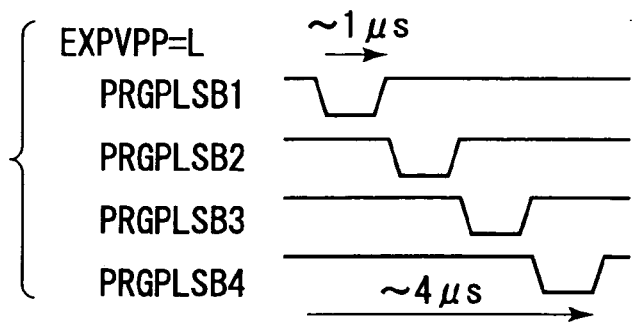
FIG. 14A is an operation waveform diagram at the normal program operation time in the program circuit according to the first embodiment.
Figure 14B:
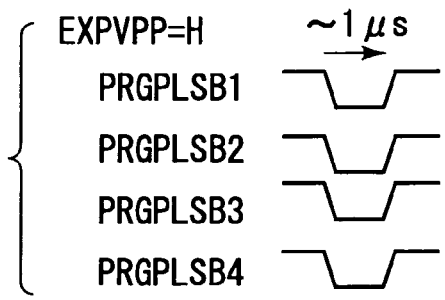
FIG. 14B is an operation waveform diagram when the Vddh switch circuit and Vddp switch circuit of the program circuit according to the first embodiment are used.

FIG. 13 is a circuit diagram showing a program circuit and FIGS. 14A, 14B are waveform diagrams showing the operation waveforms of the program circuit. A bit line BL in the memory cell array is connected to a data line DL via an NMOS transistor QN13 of the column gate according to a selected column address. The data line DL is biased by a voltage value of the voltage VSWBS at timing of a signal PRGPLSB according to program data PRGDATA in the program circuit. When data is programmed, the power supply voltage is lowered and the supply current of the Vddp charge pump 34 is reduced in the normal program operation in which the voltage is internally boosted by use of the Vddp charge pump 34. Therefore, the number of bits which can be simultaneously programmed is so determined that one word will be equal to four bits.

Figure 16:
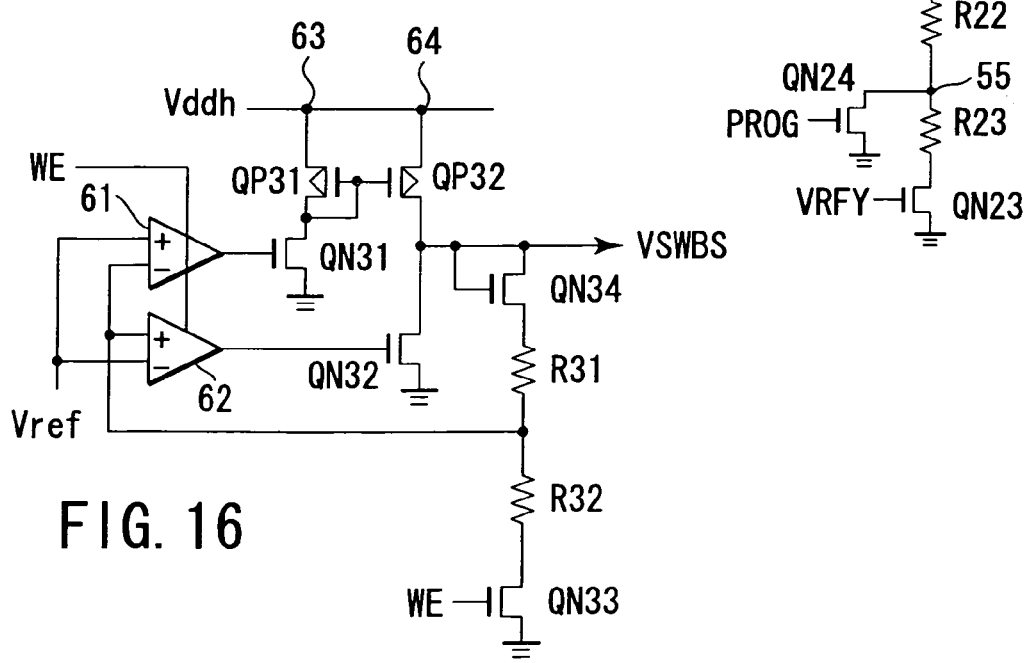
FIG. 16 is a circuit diagram showing the configuration of a VSWBS regulator according to the first embodiment.

As shown in FIG. 13, when 16 bits are programmed, program data items PRGDATA1 to PRGDATA16 are divided into four groups. Then, an inverted signal PRGPLSB1 of the program pulse is assigned to the program data items PRGDATA1 to PRGDATA4, an inverted signal PRGPLSB2 of the program pulse is assigned to the program data items PRGDATA5 to PRGDATA8, an inverted signal PRGPLSB3 of the program pulse is assigned to the program data items PRGDATA9 to PRGDATA12, and an inverted signal PRGPLSB4 of the program pulse is assigned to the program data items PRGDATA13 to PRGDATA16. As shown in FIG. 14A, 16 bits are programmed for every four bits in four different program operations by sequentially setting the program pulses PRGPLSB1 to PRGPLSB4 to "L", that is, sequentially setting the pulses PRGPLS1 to PRGPLS4 to "H".

In a case where the voltage Vpp is supplied from the exterior in order to perform the high-speed program operation, the ability of supplying voltage from the Vpp pad is higher than the voltage supply ability from the Vddp charge pump and the rise time of the word line power supply voltage Vddh applied to the word line becomes shorter. Therefore, the number of bits which can be simultaneously programmed can be increased. Thus, as shown in FIG. 14B, one word=16 bits can be programmed at the same time by simultaneously setting the program pulses PRGPLSB1 to PRGPLSB4 to "L", that is, simultaneously setting the pulses PRGPLS1 to PRGPLS4 to "H". Therefore, the program pulse application time can be reduced to ¼ times that of the former case. As a result, the total program time can be extremely reduced.

Figure 15:
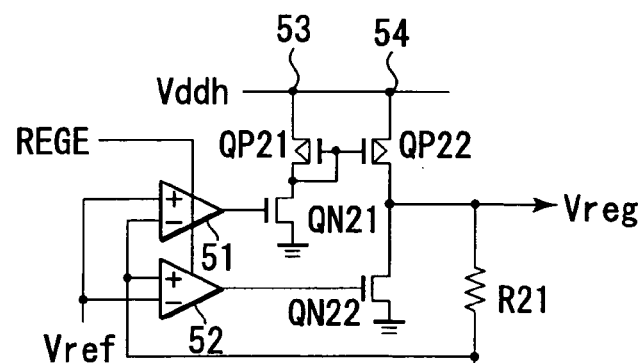
FIG. 15 is a circuit diagram showing the configuration of a Vreg regulator according to the first embodiment.

FIG. 15 shows the concrete configuration of the regulator 12 shown in FIG. 7 which is used in the flash memory according to the embodiment of the present invention and generates the control voltage Vreg which causes the voltage Vddh generated from the Vddh generator 13 to be supplied to a word line selected by the row decoder.

The regulator 12 includes two comparators 51, 52, PMOS transistor QP21, PMOS transistor QP22, NMOS transistors QN21, QN22, QN23, QN24 and voltage dividing resistors R21, R22, R23.

The comparators 51, 52 are controlled and activated according to a regulator activation signal REGE. The source of the PMOS transistor QP21 is connected to a supply node 53 of the word line power supply voltage Vddh and the gate thereof is connected to its own drain. The source of the PMOS transistor QP22 is connected to a supply node 54 of the word line power supply voltage Vddh, the gate thereof is connected to the gate of the PMOS transistor QP21, and the drain thereof is connected to a control voltage Vreg output node. Thus, the PMOS transistor QP22 is combined with the PMOS transistor QP21 to configure a current mirror circuit. The drain of the NMOS transistor QN21 is connected to the drain of the PMOS transistor QP21, the source thereof is connected to a ground voltage node and the gate thereof is supplied with an output signal of the comparator 51. The drain of the NMOS transistor QN22 is connected to the drain of the PMOS transistor QP22, the source thereof is connected to the ground voltage node and the gate thereof is supplied with an output signal of the comparator 52. The resistors R21, R22, R23 are serially connected between the control voltage Vreg output node and the ground voltage node. The source-drain path of the NMOS transistor QN23 is connected between the ground voltage node and the resistor R23, that is, one of the three resistors R21, R22, R23 which is arranged in the nearest position to the ground voltage node and the gate thereof is supplied with a verify signal. The source-drain path of the NMOS transistor QN24 is connected between the ground voltage node and a serial connection node 55 of the resistors R22 and R23 and the gate thereof is supplied with a program signal PROG.

The comparators 51, 52 each compare divided voltage of the serial connection node of the resistors R21 and R22 with reference voltage Vref. Then, the NMOS transistors QN21, QN22 are controlled to be turned ON/OFF based on the comparison results to charge or discharge the voltage Vreg node which is the output node. Therefore, the output voltage Vreg is always controlled to be set equal to the program voltage Vg=9V. As a result, the program voltage Vg=9V is supplied to the word line WL of the memory cell array via the row decoder.

FIG. 16 shows the configuration of a VSWBS regulator which generates control voltage VSWBS to clamp the voltage Vddp to optimum program bit line voltage.

The VSWBS regulator includes two comparators 61, 62, PMOS transistor QP31, PMOS transistor QP32, NMOS transistors QN31, QN32, QN33, QN34 and voltage dividing resistors R31, R32.

The comparators 61, 62 are controlled and activated according to a write enable signal WE. The source of the PMOS transistor QP31 is connected to a supply node 63 of the word line power supply voltage Vddh and the gate thereof is connected to its own drain. The source of the PMOS transistor QP32 is connected to a supply node 64 of the word line power supply voltage Vddh, the gate thereof is connected to the gate of the PMOS transistor QP31, and the drain thereof is connected to an output node of the output voltage VSWBS. Thus, the PMOS transistor QP32 is combined with the PMOS transistor QP31 to configure a current mirror circuit. The drain of the NMOS transistor QN31 is connected to the drain of the PMOS transistor QP31, the source thereof is connected to a ground voltage node and the gate thereof is supplied with an output signal of the comparator 61. The drain of the NMOS transistor QN32 is connected to the drain of the PMOS transistor QP32, the source thereof is connected to the ground voltage node and the gate thereof is supplied with an output signal of the comparator 62. The gate and drain of the NMOS transistor QN34 are connected to the output voltage VSWBS output node. The resistors R31, R32 are serially connected between the source of the NMOS transistor QN34 and the drain of the NMOS transistor QN33. The source of the NMOS transistor QN33 is connected to the ground voltage node and the gate thereof is supplied with the write enable signal WE.

The comparators 61, 62 each compare divided voltage of the serial connection node of the resistors R31 and R32 with reference voltage Vref. Then, the NMOS transistors QN31, QN32 are controlled to be turned ON/OFF based on the comparison results to charge or discharge the voltage VSWBS node which is the output node. Therefore, the output voltage VSWBS is controlled to attain the voltage VSWBS=approximately 7V. As a result, the data line DL is biased and the program operation with respect to the memory cell can be performed.

Figure 17:
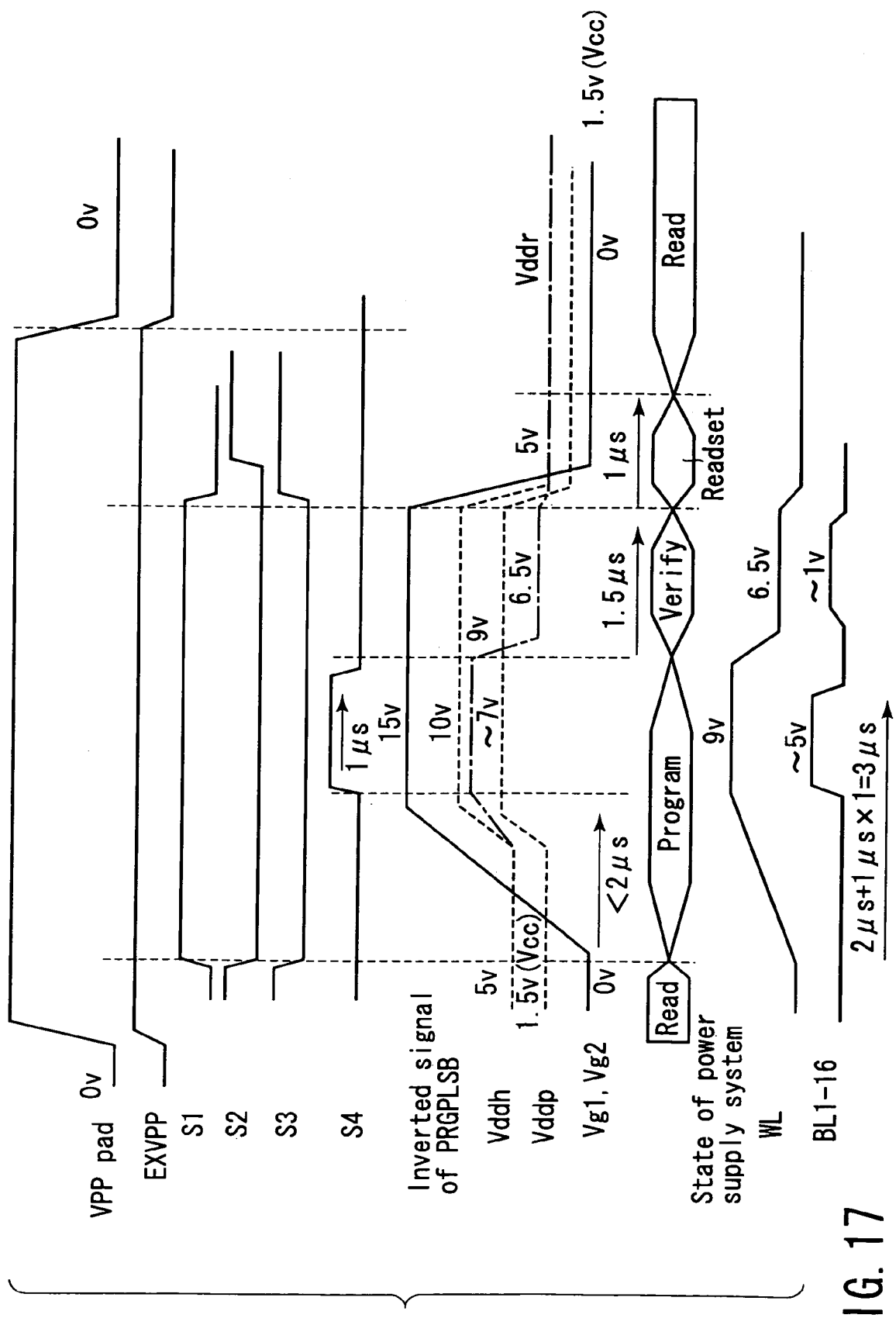
FIG. 17 is an operation waveform diagram when the Vddh switch circuit and Vddp switch circuit of the flash memory according to the first embodiment are used.

FIG. 17 shows operation waveforms when the Vddh switch circuit according to the present embodiment is used. In this case, a signal S1 is used to control the program operation and verify operation. A signal S2 is used to control the initialization operation. A signal S3 is used to control the discharging operation and a signal S4 is input to the program circuit and used to control timing at which voltage is applied to the bit line BL.

First, for example, a high voltage of approximately 12.6V is applied to the Vpp pad 21. Then, if application of the high voltage is detected by the detector circuit 22, the signal EXVPP is set to "H". If EXVPP="H" is input to the Vddh switch circuit 25 and Vddp switch circuit 30, the discharging and initialization operations are terminated. Then, after the signals S2 and S3 are set to "L", the voltages Vg1 and Vg2 respectively applied to the gates of the NMOS transistors QN1, QN2 are raised to approximately 15V. At this time, Vddh=10V is applied to the gate of the NMOS transistor QN11.

If the voltages Vg1, Vg2 are set equal to approximately 15V, the voltage Vddh is raised to 9V or 10V and the voltage Vddp is raised to approximately 10V, then the voltage Vreg=9V controlled by the regulator 12 is applied to the word line WL. Further, the voltage Vddh=10V is supplied as the power supply voltage of the Vddp switch circuit 30 or the like and the voltage Vddp=10V is supplied to the program circuit 31. Therefore, a voltage of 5V is applied to the bit line BL via the column gate. As a result, the operation of simultaneously programming 16 bits is started at the timing of the program pulse signal PRGPLS.

After this, the voltage of the word line WL is set to approximately 6.5V, the voltage of the bit line BL is set to approximately 1V and the program verify operation to detect whether the program operation is terminated or not is performed. Thus, the program operation and the program verify operation are terminated.

If the program operation and the program verify operation are terminated, the signal S3 is set ON to start the discharging operation. After this, the signal S2 is set ON to start the initialization operation.

Figure 18:
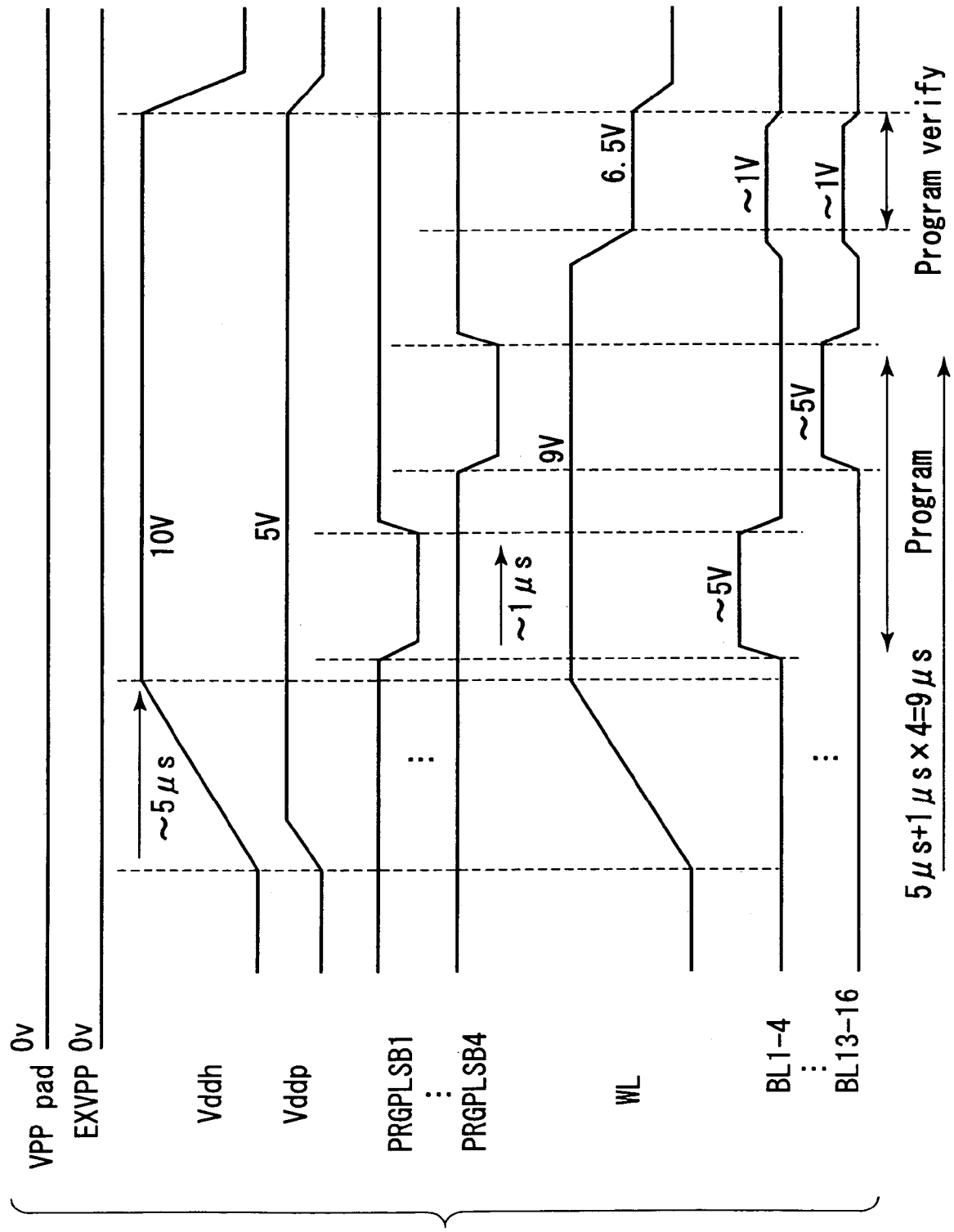
FIG. 18 is an operation waveform diagram at the normal program operation time in the flash memory according to the first embodiment.

FIG. 18 shows operation waveforms at the time of the normal program operation. Since the voltage Vpp is boosted by use of the internal Vddh booster circuit 23 and Vddp booster circuit 24, the Vpp pad 21 is set at 0V and the output signal EXVPP of the detector circuit 22 is set at "L"=0V.

When the voltages Vddh and Vddp are set to sufficiently high levels, a voltage of 9V is applied to the word line WL. Further, a voltage of 5V is sequentially applied to the bit lines BL for every four bits at timings of the program pulse signals PRGPLSB1 to PRGPLSB4 and the program operation is performed for every four bits.

Second Embodiment

Next, a switch circuit according to a second embodiment of the present invention is explained with reference to FIGS. 19A, 19B, 19C.

Figures 19A, 19B, 19C:
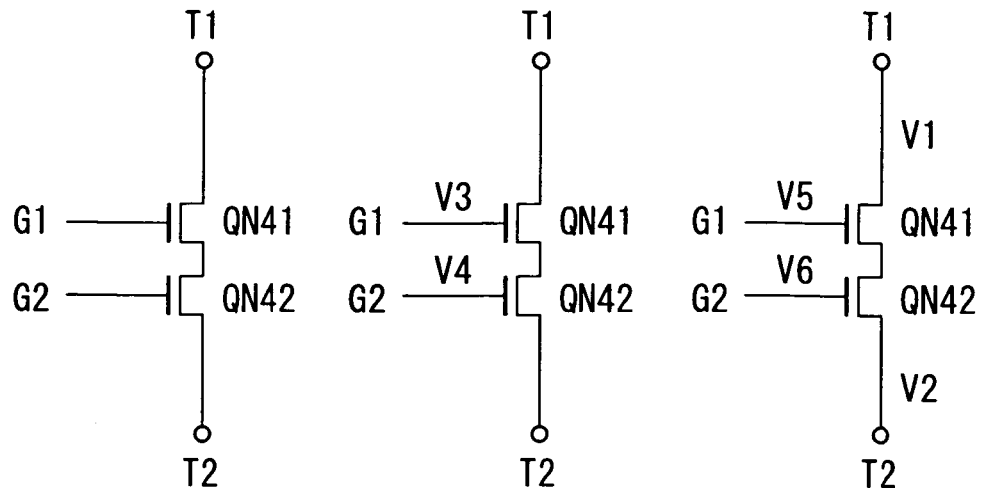
FIGS. 19A, 19B, 19C are circuit diagrams showing the configurations of a switch circuit according to a second embodiment of the present invention.

As shown in FIG. 19A, the switch circuit includes NMOS transistors QN41, QN42. The drain of the NMOS transistor QN41 is connected to a terminal T1 connected to an external terminal (not shown) which is supplied with voltage from the exterior. The drain of the NMOS transistor QN42 is connected to the source of the NMOS transistor QN41 and the source thereof is connected to an output terminal T2. The threshold voltage of the NMOS transistor QN42 is higher than that of the NMOS transistor QN41.

As shown in FIG. 19B, when the switch circuit is set in the OFF state, for example, voltage V3=Vcc is applied to the gate of the NMOS transistor QN41 and a voltage V4 of 0V which is different from the voltage V3 is applied to the gate of the NMOS transistor QN42. In this case, since the threshold voltage of the NMOS transistor QN41 is low, there occurs a possibility that the voltage of a circuit (not shown) connected to the output terminal T2 may leak into the terminal T1 side. Therefore, in order to prevent extra voltage from leaking into the terminal T1 side by use of the NMOS transistor QN42 having higher threshold voltage than the NMOS transistor QN41, the NMOS transistor QN42 is set in the cut-off state.

As shown in FIG. 19C, when the switch circuit is set in an ON state, high voltage V1 is applied to the terminal T1. At this time, voltage V5 which turns ON the NMOS transistor QN41 is applied to the gate of the NMOS transistor QN41 with the high voltage V1 kept applied to the terminal T1. Further, voltage V6 which is higher than voltage V2 of the output terminal T2 by the threshold voltage is applied to the gate of the NMOS transistor QN42. By thus setting the voltages V5, V6 supplied to the respective gates in the above-described manner, the output voltage V2 of the switch circuit is controlled to attain the relation of V2<V1. Therefore, like the first embodiment, it becomes possible to lower the high voltage supplied from the exterior and stably supply the voltage to the transistors in the chip. Since the switch circuit can be configured without using a PMOS transistor, the circuit area can be reduced.

Next, a semiconductor device according to the second embodiment of this invention and containing the switch circuit of FIG. 19A is explained with reference to FIG. 20. The other configuration of the semiconductor device is the same as that of the first embodiment.

Figure 20:
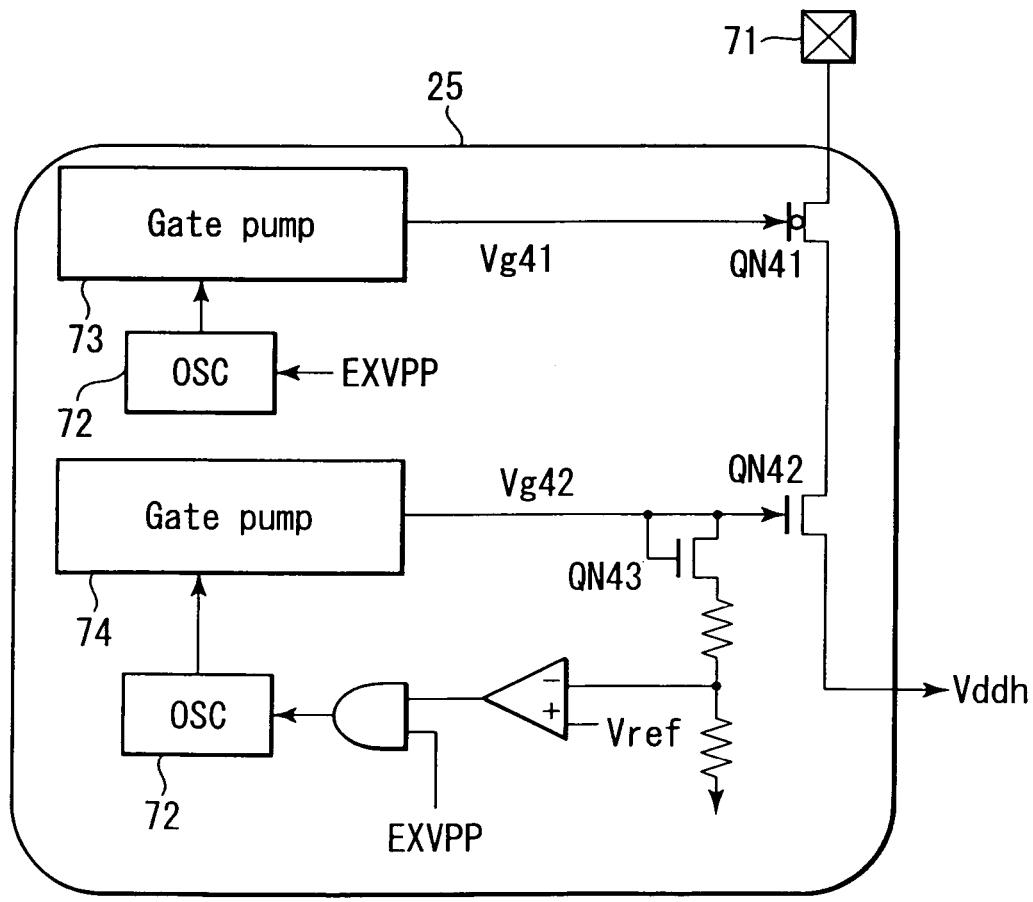
FIG. 20 is a circuit diagram showing the configuration of a Vddh switch circuit according to the second embodiment.

FIG. 20 is a circuit diagram showing a Vddh switch circuit according to the second embodiment of this invention.

The Vddh switch circuit according to the second embodiment of this invention includes oscillator circuits (OSC) 72, first and second gate pumps 73, 74, and NMOS transistors QN41, QN42, QN43.

The operation of the oscillator circuit (OSC) 72 is started in response to an output signal EXVPP of a detector circuit. Each of the first and second gate pumps 73, 74 outputs a voltage of approximately 15V in response to an output of the oscillator 72. The gate of the NMOS transistor QN41 is connected to the output terminal of the first gate pump 73 and the drain thereof is connected to a Vpp pad 71. The NMOS transistor QN42 is connected in series with the NMOS transistor QN41 and the gate thereof is connected to the output terminal of the second gate pump 74. The gate and drain of the NMOS transistor QN43 are connected to the output terminal of the second gate pump 74.

Gate voltage Vg41 of the NMOS transistor QN41 or one of the two NMOS transistors QN41 and QN42 connected between the Vpp pad 71 and the output node which is disposed nearer to the Vpp pad 71 is set to Vcc at the normal program operation time. Further, the gate voltage Vg41 is set to a voltage of approximately 15V when the high-speed program operation is performed by use of the Vpph switch circuit 25. Therefore, a voltage Vpp of approximately 12V is transferred to the NMOS transistor QN42. Gate voltage Vg42 of the NMOS transistor QN42 is set at 0V at the normal program operation time and the NMOS transistor QN42 is set into the cut-off state so as to prevent voltage Vddh boosted by the Vddh booster circuit from leaking into the Vpp pad 71 side at the normal program operation time. Further, at the high-speed program operation time, the voltage value of the gate voltage Vg42 is controlled by performing the feedback operation to set voltage between the source and drain of the NMOS transistor QN43 which has the same configuration as the NMOS transistor QN42 to the voltage Vddh of 10V. As a result, the NMOS transistor QN43 outputs the voltage Vddh of 10V.

Thus, the voltage Vddh of 10V can be attained based on the voltage Vpp of 12V without using a PMOS transistor. As a result, the speed of the program operation can be further enhanced and the circuit area can be reduced.

Third Embodiment

Next, a switch circuit according to a third embodiment of the present invention is explained with reference to FIGS. 21A, 21B. The other configuration of the semiconductor device is the same as that of the first embodiment.

Figure 21A:
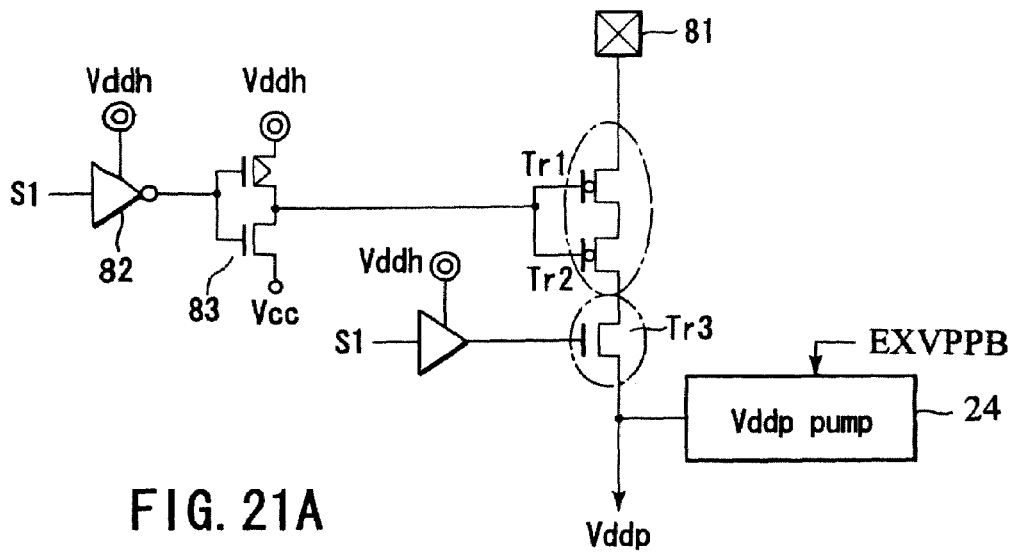
FIG. 21A is a circuit diagram showing the configuration of a Vddp switch circuit according to a third embodiment of the present invention.
Figure 21B:
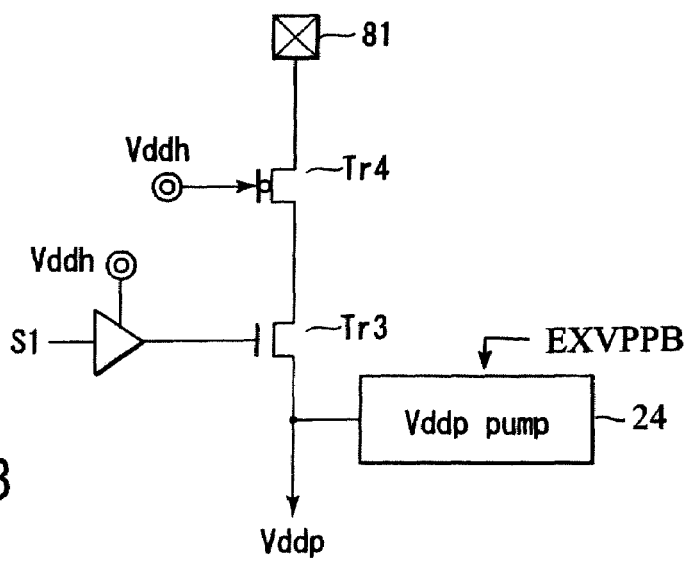
FIG. 21B is a circuit diagram showing the configuration of a modification of the Vddp switch circuit according to the third embodiment.

FIGS. 21A, 21B are circuit diagrams showing a Vddp switch circuit according to a third embodiment of the present invention.

As shown in FIG. 21A, the Vddp switch circuit according to the third embodiment of the present invention includes two transistors Tr1, Tr2 which are serially connected to a Vpp pad 81 and whose gates are connected together, and a transistor Tr3 connected between the transistor Tr2 and a voltage Vddp output node.

When a voltage Vpp of 12V is supplied to the Vpp pad 81 from the exterior, a word line power supply voltage Vddh of 10V is input to the gates of the transistors Tr1, Tr2 via inverters 82, 83 according to a signal S1 which controls the program operation and verify operation. Therefore, the transistors Tr1, Tr2, Tr3 transfer voltage obtained by lowering the voltage VPP of 12V to the voltage Vddp output node and a voltage Vddp of approximately 7V is output from the voltage Vddp output node. At this time, the transistor Tr3 is used to be set into the cut-off state so as to prevent the voltage Vddp boosted by the Vddp booster circuit 24 from leaking into the Vpp pad 81 side at the normal program operation time.

FIG. 21B shows a modification of the Vddp switch circuit according to the third embodiment of the present invention.

As shown in FIG. 21B, the Vddp switch circuit includes a transistor Tr4 used instead of the transistors Tr1, Tr2 shown in FIG. 21A and a voltage Vddh of 10V is directly input to the gate of the transistor Tr4.

In the Vddp switch circuits shown in FIGS. 21A, 21B, the voltage Vddp can be generated without using a pump circuit which internally boosts the voltage by applying the voltage Vddh to the gate of the transistor which transfers the high voltage supplied from the Vpp pad 81. Therefore, voltage transfer time can be shortened and program operation time can be shortened.

A semiconductor device according to the embodiment of the present invention can be attained by adequately combining the Vddh switch circuit and the Vddp switch circuit according to the first to third embodiments. Therefore, for example, it is possible to arrange the Vddh switch circuit according to the first embodiment and the Vddp switch circuit according to the third embodiment in the same chip and use a combination of the Vddh switch circuit according to the second embodiment and the Vddp switch circuit according to the third embodiment.

Further, the semiconductor device according to the embodiment of the present invention can be applied not only to a NOR type flash memory but also to a DINOR type flash memory. In addition, this invention is not limited to the above embodiments and the semiconductor device according to the embodiment of the present invention can be applied to a switch circuit which lowers voltage input from the exterior and supplies the lowered voltage to the chip.

According to the embodiment of the present invention, the transistors in the chip can be operated in a stable region by controlling voltage supplied from the exterior and transferring the same to the chip when it is desired to program data at high speed. Further, since the voltage is supplied from the exterior, the operation of boosting the word line voltage can be performed at high speed and program operation time can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first transistor of a first conductivity type having a source coupled to an input terminal and a gate to which a first voltage controlled by a control signal is supplied;
   a second transistor of the first conductivity type having a source coupled to a drain of the first transistor and a gate coupled to the gate of the first transistor;
   a third transistor of a second conductivity type having a drain coupled to a drain of the second transistor, a source coupled to an output terminal, and a gate to which a second voltage controlled by the control signal is supplied; and
   a booster circuit which is coupled to a node between the source of the third transistor and the output terminal and outputs a boosted voltage to the node.

2. The semiconductor device according to claim 1, wherein:
   when an external voltage is applied to the input terminal and the first, second, and third transistors are activated by the control signal, a voltage obtained by lowering the external voltage is supplied to the output terminal; and
   when the external voltage is not applied to the input terminal or the first, second, and third transistors are deactivated by the first and second voltages the boosted voltage outputted from the booster circuit is supplied to the output terminal.

3. The semiconductor device according to claim 2, wherein the deactivated third transistor cuts off the boosted voltage outputted from the booster circuit so as to prevent the boosted voltage from being supplied to the input terminal.

4. A semiconductor device comprising:
   a first transistor of a first conductivity type having a source coupled to an input terminal and a gate to which a first voltage is supplied;
   a second transistor of a second conductivity type having a drain coupled to the source of the first transistor, a source coupled to an output terminal, and a gate to which a second voltage based on a control signal is supplied and;
   a booster circuit which is coupled to a node between the source of the second transistor and the output terminal and outputs a boosted voltage to the node.

5. The semiconductor device according to claim 4, wherein:
   when an external voltage is applied to the input terminal and the first and second transistors are activated by the first and second voltages a voltage obtained by lowering the external voltage is supplied to the output terminal; and
   when the external voltage is not applied to the input terminal or the first and second transistors are deactivated by the first and second voltages, the boosted voltage outputted from the booster circuit is supplied to the output terminal.

6. The semiconductor device according to claim 5, wherein the deactivated second transistor cuts off the boosted voltage outputted from the booster circuit so as to prevent the boosted voltage from being supplied to the input terminal.

* * * * *